(12) United States Patent
Kikuchi et al.

(10) Patent No.: US 6,599,782 B1
(45) Date of Patent: *Jul. 29, 2003

(54) SEMICONDUCTOR DEVICE AND METHOD OF FABRICATING THEREOF

(75) Inventors: Shuichi Kikuchi, Gunma (JP); Yumiko Akaishi, Gunma (JP); Takuya Suzuki, Saitama (JP)

(73) Assignee: Sanyo Electric Co., Ltd., Osaka (JP)

( * ) Notice: Subject to any disclaimer, the term of this patent is extended or adjusted under 35 U.S.C. 154(b) by 43 days.

This patent is subject to a terminal disclaimer.

(21) Appl. No.: 09/716,782

(22) Filed: Nov. 20, 2000

(30) Foreign Application Priority Data

Jan. 20, 2000 (JP) .......................... 2000-011829

(51) Int. Cl.[7] .................. H01L 21/339; H01L 21/8238; H01L 21/338; H01L 21/336
(52) U.S. Cl. .................. 438/147; 438/217; 438/174; 438/194; 438/268; 438/289; 438/301
(58) Field of Search ................. 438/147, 217, 438/174, 194, 268, 289, 301

(56) References Cited

U.S. PATENT DOCUMENTS 6,048,772 A * 4/2000 D'Anna
6,190,978 B1 * 2/2001 D'Anna
6,207,518 B1 * 3/2001 Akaishi et al.
6,255,154 B1 * 7/2001 Akaishi et al.
2001/0011745 A1 * 8/2001 Kushida

FOREIGN PATENT DOCUMENTS

JP 2000183181 A * 6/2000

* cited by examiner

*Primary Examiner*—John F. Niebling
*Assistant Examiner*—Stanetta Isaac
(74) *Attorney, Agent, or Firm*—Fish & Richardson P.C.

(57) ABSTRACT

To enhance the withstand voltage of an LD MOS transistor, a method of fabricating a semiconductor device according to the invention is characterized in that a process for forming a drift region is composed of a step for implanting phosphorus ions and arsenic ions different in a diffusion coefficient into the superficial layer of a substrate, a step for forming a selective oxide film (a first gate insulating film) 9A and an element isolation film 9B by selective oxidation and diffusing the phosphorus ions and the arsenic ions and a step for implanting and diffusing boron ions, and in that in the step for forming the selective oxide film 9A and the element isolation film 9B by selective oxidation in a state in which an oxide film and a polycrystalline silicon film are laminated on the substrate, only a drift region formation region is selectively oxidized in a state in which the polycrystalline silicon film is removed.

8 Claims, 7 Drawing Sheets

SEMICONDUCTOR DEVICE AND METHOD OF FABRICATING THEREOF

BACKGROUND OF THE INVENTION

1. Field of the Invention

The present invention relates to a semiconductor device and method of fabricating thereof, in detail, further relates to the technology of a lateral double-diffused (LD) MOS transistor as a high-voltage device utilized for IC for driving a liquid crystal and others.

2. Description of the Related Art

In LD MOS transistor structure, a new diffusion region is formed by diffusing impurities the respective conductive types of which are different into a diffusion region formed on the side of the surface of a semiconductor substrate so as to utilize difference in diffusion in a lateral direction between these diffusion regions for effective channel length, and the corresponding device becomes a device suitable for reducing on-state resistance because a short channel is formed.

FIG. 20 is a sectional view for explaining a conventional type LD MOS transistor and for an example, N-channel LD MOS transistor structure is shown. Though the description of P-channel LD MOS transistor structure is omitted, the structure is similar as well known because it is different from the N-channel LD MOS transistor structure in only a conductive type.

As shown in FIG. 20, a reference number 1 denotes a semiconductor substrate the conductive type of which is a P type for example, 2 denotes an N-type well region, when a P-type body (PB) region 3 is formed in the N-type well region 2, an N+-type diffusion region 4 is formed in the P-type body region 3 and an N+-type diffusion region 5 is formed in the N-type well region 2. A gate electrode 7 is formed on the surface of the substrate via a gate insulating film 6 and a channel region 8 is formed in the superficial region of the P-type body region 3 immediately under the gate electrode 7.

The N+-type diffusion region 4 functions as a source region, the N+-type diffusion region 5 functions as a drain region and the N-type well region 2 formed from an region under the gate electrode 7 so that it surrounds the drain region functions as a drift region. S and D respectively denote a source electrode and a drain electrode, a reference number 12 denotes a P+-type diffusion region for applying electric potential to the P-type body region 3 and 11 denotes a layer insulation film.

In the LD MOS transistor, the concentration in the superficial region of the N-type well region 2 is increased by diffusing impurities into the N-type well region 2, current easily flows in the superficial region of the N-type well region 2 and withstand voltage can be enhanced. The LD MOS transistor composed as described above is called a reduced surface field type (RESURF) LD MOS transistor and the dopant concentration in the drift region of the N-type well region 2 is set so that it meets a RESURF condition. Such technique is disclosed in JP-A-9-139438 and others.

However, as the N-type well region 2 shown in FIG. 20 is formed so that it evenly has the same depth, it prevents the enhancement of withstand voltage and the reduction of on-state resistance region from being accelerated.

SUMMARY OF THE INVENTION

Therefore, the invention provides a semiconductor device that can meet a demand for enhancing withstand voltage and reducing on-state resistance and enables the further enhancement of withstand voltage by further optimizing the fabricating method.

In order to perform the above object, the method according to the invention to achieve the object is a method of fabricating a semiconductor device has a gate electrode formed on the semiconductor substrate via first and second gate insulating films whose thickness are different from each other, and a step of forming the drift region comprises a step of doping ions so that said drift region is formed so that depth is thin under the gate electrode and thick near drain region, by utilizing difference in a diffusion coefficient between at least two types of the same conductive type of impurities different in a diffusion coefficient and reverse conductive type of impurities having a diffusion coefficient substantially equal to or exceeding the diffusion coefficient of the one type of impurities of the two types of impurities The fabricating method of a semiconductor device is characterized in that a process for forming a drift region is composed of a step for implanting at least two types of second conductive type impurities different in a diffusion coefficient into the surface layer of a substrate, a step for forming a first gate insulating film and a element isolation film by selective oxidation and respectively diffusing at least the two types of second conductive type impurities and a step for implanting and diffusing at least one type of first conductive type impurities having a diffusion coefficient approximately equal to or exceeding the diffusion coefficient of at least one type of second conductive type impurities, and in the step for forming the first gate insulating film and the element isolation film by selective oxidation in a state in which an oxide film and a polycrystalline silicon film or an oxide film and an amorphous silicon film are laminated on the substrate, only an region in which the drift region is formed is selectively oxidized in a state in which the polycrystalline silicon film or the amorphous silicon film is removed in a state, and the concentration of impurities in the drift region in the surface layer of the substrate can be reduced by suitably doping impurities implanted into the drift region formation region in the first gate insulating film when the first gate insulating film is formed.

A semiconductor device of the present invention is characterized in that said drift region is formed so that depth is thin under the gate electrode and thick near drain region, and said drift region is formed so that impurity concentration in said drift region under the first gate insulating film is lower than that under the second gate insulating film whose thickness is thinner than that of the first insulating film.

According the above device, impurity for example arsenic ions are prevented from being diffused in the substrate for the while, the decrease of the concentration of the arsenic ions under the first gate insulating film (selective oxide film 9A) was not enough, the concentration of the first N− layer 22A under the selective oxide film 9 become high and operating withstand voltage decreased because of electrostatic focusing.

DETAILED DESCRIPTION OF THE PREFERRED EMBODIMENT

Figure 1:
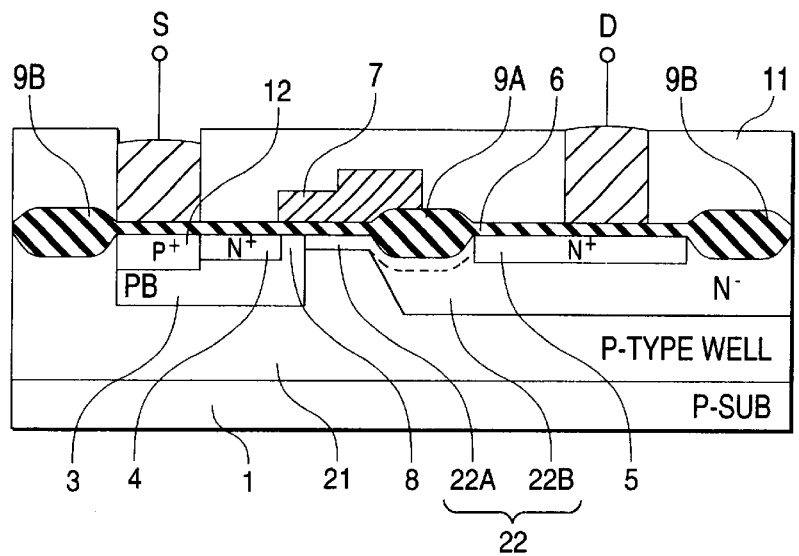
FIG. 1 is a sectional view showing the fabricating method of a semiconductor device according to the invention.

Referring to the drawings, the fabricating method of a semiconductor device according to the invention will be described below.

Embodiment 1

FIG. 1 is a sectional view for explaining an LD MOS transistor according to the invention and for an example, N-channel LD MOS transistor structure is shown. Though the description of P-channel LD MOS transistor structure is omitted, the structure is different in only the conductive type and has the similar structure as well known. The same reference number is allocated to the similar part to a part in a conventional type and the description is simplified.

As shown in FIG. 1, a reference number 1 denotes a semiconductor substrate the conductive type of which is a P type for example, 21 denotes a P-type well region, an N– layer 22 is formed in the P-type well region 21 and a P-type body (PB) region 3 is formed. An N+-type diffusion region 4 is formed in the P-type body region 3 and an N+-type diffusion region 5 is formed in the N– layer 22.

Further, a gate electrode 7 is formed on both a selective oxide film 9A (a first gate insulating film) and a gate oxide film 6 (a second gate insulating film) on the surface of the substrate and a channel region 8 is formed in the superficial region of the P-type body region 3 immediately under the gate electrode 7.

The N+-type diffusion region 4 functions as a source region, the N+-type region diffusion region 5 functions as a drain region and the N–layer 22 formed from a region under the gate electrode 7 so that it surrounds the drain region functions as a drift region. A source electrode S and a drain electrode D, which are not shown in the drawings, are formed to come in contact with the N+-type diffusion regions 4 and 5 as in conventional type configuration, a P-type diffusion region 12 which is adjacent to the N+-type diffusion region 4 and which is provided to apply electric potential to the P-type body region 3 is formed and is coated with a layer insulation film 11.

The configuration is characterized in that the N– layer 22 is formed in the P-type well region 21, it is formed under the gate electrode 7 so that it is shallow (a first N– layer 22A) and it is formed in the vicinity of the drain region 5 so that it is deep (a second N– layer 22B) as shown in FIG. 1

Figure 9:
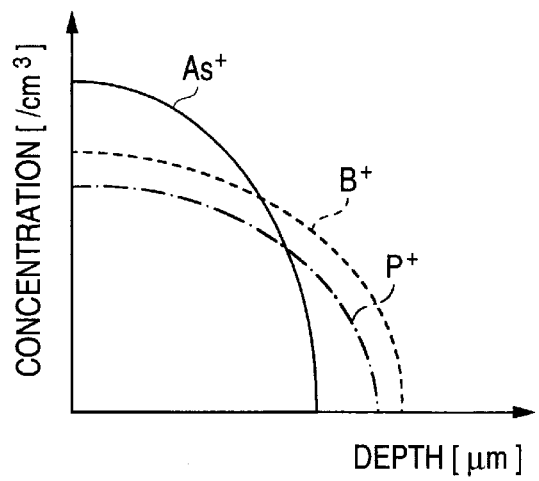
FIG. 9 shows the distribution of the concentration of various ions for explaining a drift region formation principle according to the invention.

Hereby, as the concentration of the first N– layer 22A formed under the gate electrode 7 so that the N– layer is shallow is high, on-state resistance is reduced, current more easily flows and the concentration of the second N– layer 22B in the vicinity of the drain region 5 (in a drift region position) is low, a depletion layer is more easily expanded and withstand voltage is enhanced (see a concentration distribution chart shown in FIG. 9). The N-channel LD MOS transistor in this embodiment has withstand voltage of approximately 30 V.

Referring to the drawings, a method of fabricating the semiconductor device described above will be described below.

Figure 2:
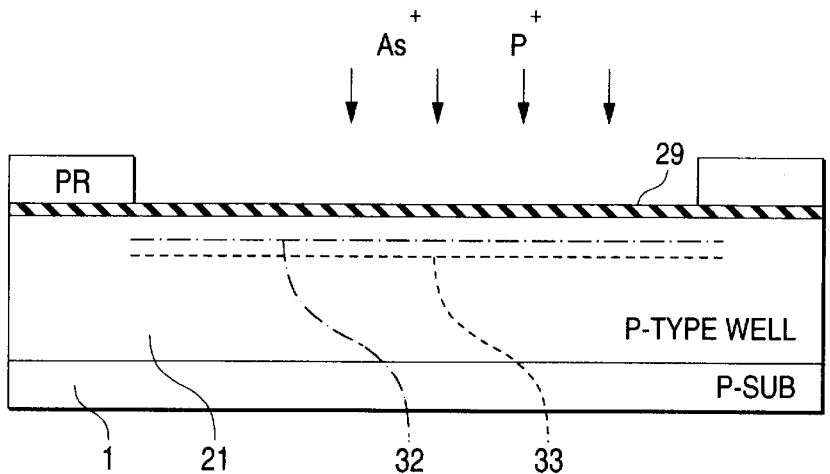
FIG. 2 is a sectional view showing the fabricating method of the semiconductor device according to the invention.

As shown in FIG. 2, after a pad oxide film 29 is formed on the P-type semiconductor substrate 1, two types of N-type impurities such as arsenic ions and phosphorus ions for forming the N– layer 22 to be the drift region in a postprocess are implanted in the P-type well region 21 using a photoresist (PR) film as a mask so as to form first and second ion implanted layers 32 and 33.

In this process, for example, arsenic ions are implanted by the implantation condition of approximately $3\times10^{12}/cm^2$ at the acceleration voltage of approximately 160 KeV and phosphorus ions are implanted by the implantation condition of approximately $4\times10^{12}/cm^2$ at the acceleration voltage of approximately 50 KeV.

Figure 3:
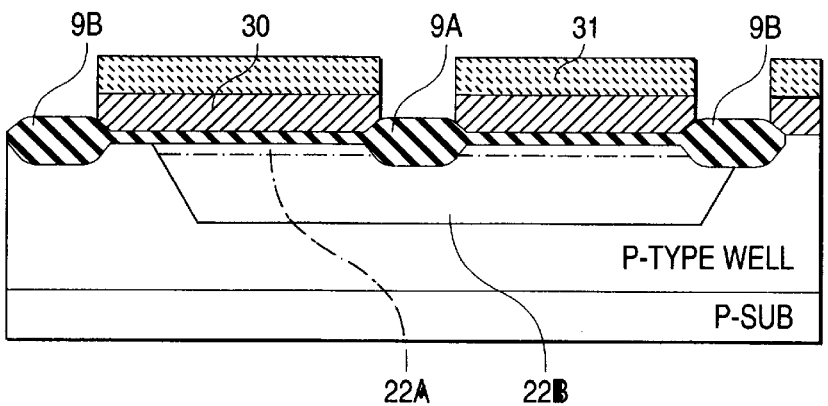
FIG. 3 is a sectional view showing the fabricating method of the semiconductor device according to the invention.

Next, as shown in FIG. 3, a polycrystalline silicon film 30 is formed on the pad oxide film 29 on the substrate 1, a selective oxide film 9 having the thickness of approximately 730 nm is formed by selectively oxidizing a predetermined region on the surface of the substrate using a silicon nitride (SiN) film 31 formed on the polycrystalline silicon film as a mask, and arsenic ions and phosphorus ions implanted in the superficial layer of the substrate as described above are diffused into the substrate. At this time, because of difference in a diffusion coefficient between the arsenic ion and the phosphorus ion, the arsenic ions are diffused inside the substrate 1, a first N– layer 22A is formed in the relatively superficial layer of the substrate, the phosphorus ions are diffused inside the substrate 1 and a second N– layer 22B is formed in a relatively deep position in the P-type well region 21.

Figure 4:
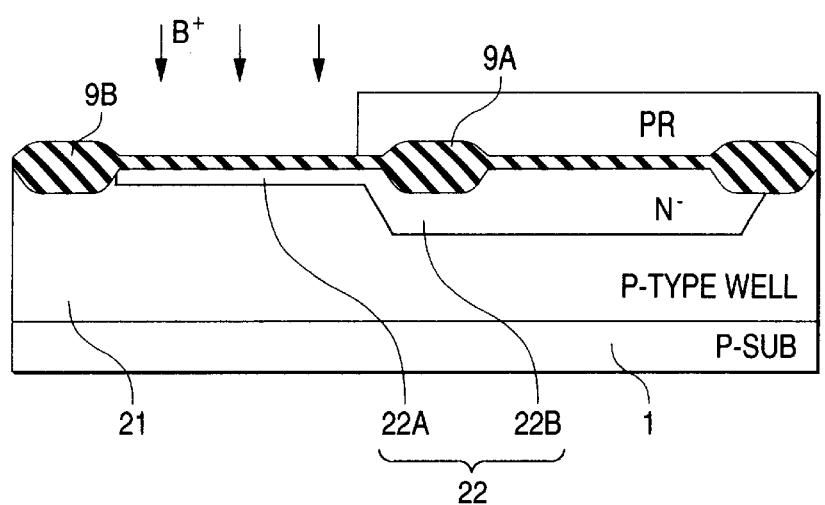
FIG. 4 is a sectional view showing the fabricating method of the semiconductor device according to the invention.

Next, as shown in FIG. 4, after a photoresist (PR) film is formed over the substrate 1 over a drain formation region, the phosphorus ions to be the second N– layer 22B of a source formation region are offset by the boron ions by implanting and diffusing P-type impurities such as boron ions in the superficial layer of the substrate to be the source formation region using the photoresist film as a mask and the second N– layer 22B of the source formation region is annihilated.

In this process, for example, after boron ions are implanted by the implantation condition of approximately $8 \times 10^{12}/cm^2$ at the acceleration voltage of approximately 80 KeV, they are thermally diffused at approximately 1100° C. for two hours. FIG. 9 shows the distribution of the concentration of arsenic ions shown by a full line, phosphorus ions shown by an alternate long and short dash line and boron ions shown by a dotted line and as clear from the drawing, the distribution of the concentration of phosphorus ions in the substrate overlaps with that of boron ions and is offset.

As described above, in the invention, the second N– layer 22B formed deep in the substrate on the side of the source formation region is offset by implanting and diffusing boron ions implanted in the postprocess utilizing difference in a diffusion coefficient between arsenic ions and phosphorus ions when the drift region is formed, only the first N– layer 22A formed in the superficial layer of the substrate is left on the side of the source formation region and the semiconductor device the on-state resistance of which is reduced can be provided in the relatively simple fabricating process.

Figure 5:
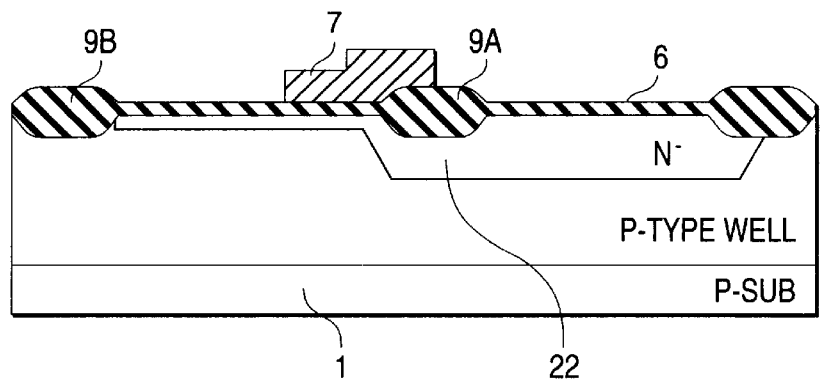
FIG. 5 is a sectional view showing the fabricating method of a semiconductor device according to the invention.

Next, as shown in FIG. 5, after the gate oxide film 6 having the thickness of approximately 80 nm is formed on the substrate 1, the gate electrode 7 having the thickness of approximately 250 nm is formed from an region on the gate oxide film 6 to an region on the selective oxide film 9.

Figure 6:
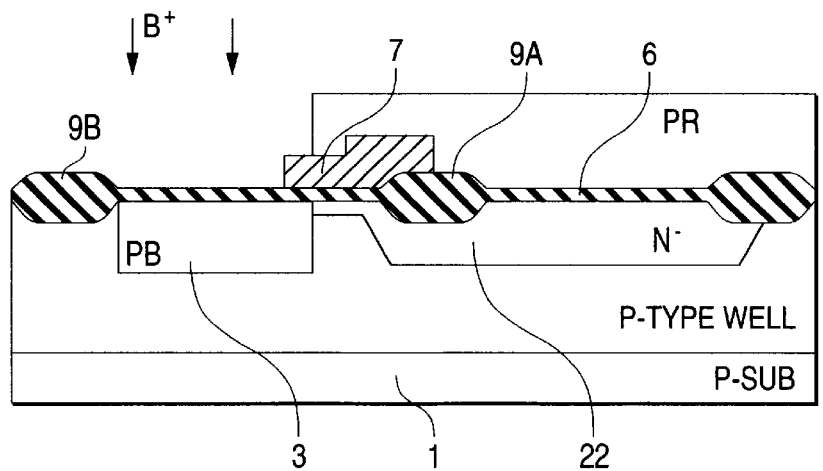
FIG. 6 is a sectional view showing the fabricating method of the semiconductor device according to the invention.

Next, as shown in FIG. 6, the P-type body region 3 is formed so that the P-type body region is adjacent to one end of the gate electrode 7 by implanting and diffusing P-type impurities such as boron ions using the photoresist (PR) film formed so that the photoresist film covers the gate electrode 7 and the drain formation region as a mask.

In this process, for example, after boron ions are implanted by the implantation condition of approximately $5 \times 10^{13}/cm^2$ at the acceleration voltage of approximately 40 KeV, they are thermally diffused at approximately 1050° C. for two hours.

Figure 7:
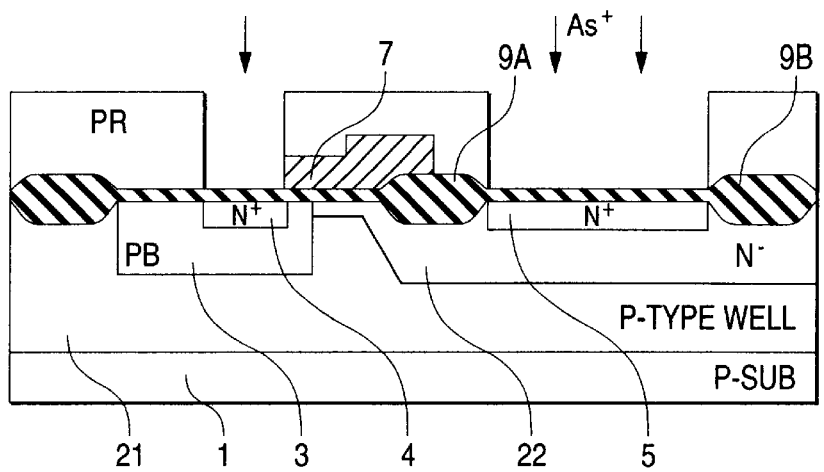
FIG. 7 is a sectional view showing the fabricating method of the semiconductor device according to the invention.

Further, as shown in FIG. 7, N-type impurities such as phosphorus ions and arsenic ions are implanted using the photoresist (PR) film having an opening over the source formation region formed in the P-type body region 3 and the drain formation region as a mask so as to form N+-type diffusion regions 4 and 5 respectively to be a source region and a drain region.

The N+-type diffusion regions 4 and 5 may also have so-called LDD structure and in that case, first, after phosphorus ions for example are implanted by the implantation condition of approximately $3.5 \times 10^{13}/cm^2$ at the acceleration voltage of approximately 40 KeV using the gate electrode 7, the selective oxide film 9A and a photoresist film not shown as a mask, a side wall spacer film is formed at the side of the gate electrode 7 and arsenic ions for example are implanted by implantation condition of approximately $5 \times 10^{15}/cm^2$ at the acceleration voltage of approximately 80 KeV using the side wall spacer film, the gate electrode 7, the selective oxide film 9A and a photoresist film not shown as a mask.

Figure 8:
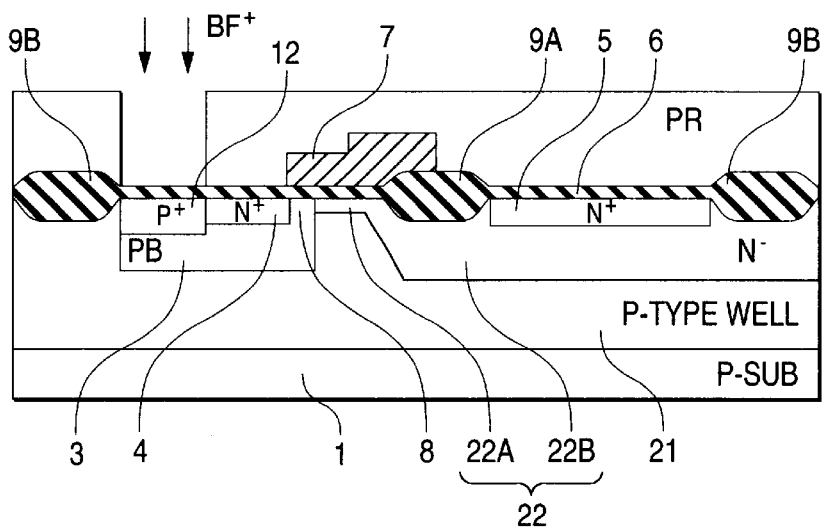
FIG. 8 is a sectional view showing the fabricating method of the semiconductor device according to the invention.

As shown in FIG. 8, P-type impurities such as boron difluoride ions are implanted using a photoresist (PR) film as a mask so as to form the P-type diffusion region 12 formed in a position adjacent to the N-type diffusion region 4 to apply electric potential to the P-type body region 3. In this process, for example, boron difluoride ions are implanted by implantation condition of approximately $4 \times 10^{15}/cm^2$ at the acceleration voltage of approximately 60 KeV.

After a layer insulation film 11 is formed as in the conventional type configuration, the source electrode (S) and the drain electrode (D) are formed and the semiconductor device as shown in FIG. 1 is completed.

As described above, in the semiconductor device having the configuration, when the drift region is formed, the enhancement of withstand voltage and the reduction of on-state resistance are enabled by forming the drift region shallowly under the gate electrode 7 and deep in the vicinity of the drain region 5 utilizing difference in a diffusion coefficient between two types of second conductive type of impurities (phosphorus ions and arsenic ions) different in a diffusion coefficient and boron ions having a diffusion coefficient substantially equal to that of the phosphorus ions.

Embodiment 2

Referring to the drawings, a fabricating method that enables the further enhancement of withstand voltage according to the invention will be described below.

The invention is characterized in that the withstand voltage is more enhanced than that in the semiconductor device having the configuration described above by further optimizing the fabricating process when the drift region has double structure composed of regions in which phosphorus ions and arsenic ions are respectively implanted.

First, these inventors took notice of it that the concentration of the first N– layer 22A including arsenic ions was higher than an estimated value in the configuration described above.

These inventors learned that the phenomenon described above had relation to a process for forming the selective oxide film 9 by a polybuffered LOCOS method applied to the process wherein the inhibition of bird's beak growth, the relaxation of stress and others are enabled by improving a so-called LOCOS method.

In the polybuffered LOCOS method, an oxide film is grown by laminating an oxide film and a polycrystalline silicon film (or may be also an oxide film and amorphous silicon) on the substrate and thermally oxidizing the polycrystalline silicon film and the substrate respectively under an opening using an oxidation-proof film (an SiN and others) having the predetermined opening formed on the oxide film and the polycrystalline silicon film as a mask.

The inventors thought that in case this method was used, arsenic ions implanted near the interface of the substrate in the process for forming the selective oxide film 9 were not sufficiently taken in the selective oxide film 9 and therefore, the estimated decrease of the concentration did not occur. That is, the polycrystalline silicon film is oxidized prior to the substrate in oxidation by the LOCOS method because of the existence of the polycrystalline silicon film laminated on the oxide film on the substrate by the polybuffered LOCOS method.

Therefore, the arsenic ions were diffused in the substrate for the while, the decrease of the concentration of the arsenic ions under the selective oxide film 9 was not enough, the concentration of the first N– layer 22A under the selective oxide film 9 became high (as shown by dotted line in FIG. 1) and operating withstand voltage decreased because of electrostatic focusing.

Then, in the fabricating method according to the invention, a selective oxidation process is applied in a state in which a polycrystalline silicon film used in the polybuffered LOCOS method is removed only in a drift region formation region.

Figure 10:
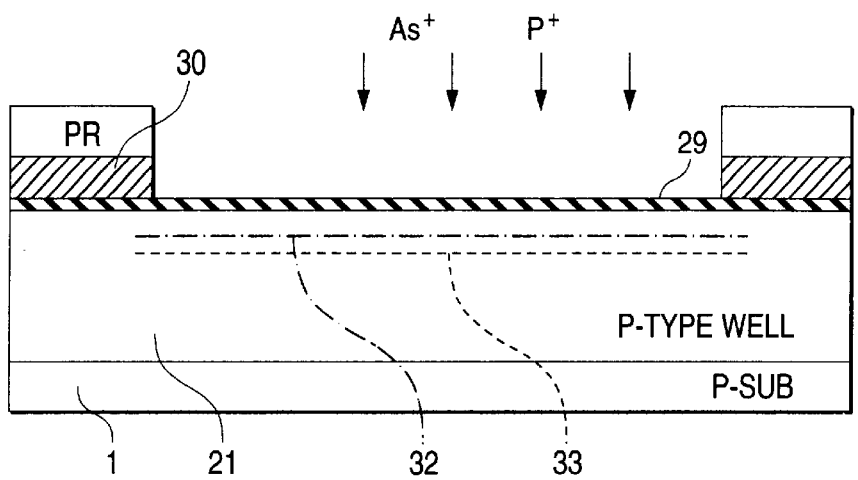
FIG. 10 is a sectional view showing the second fabricating method of a semiconductor device according to the invention.

That is, as shown in FIG. 10, after a pad oxide film 29 and a polycrystalline silicon film 30 are formed on the P-type semiconductor substrate 1 and an opening is formed in a predetermined region of the polycrystalline silicon film 30 using a photoresist (PR) film, two types of N-type impurities such as arsenic ions and phosphorus ions for forming the N– layer 22 to be a drift region in the postprocess are implanted into the P-type well region 21 using the polycrystalline silicon film 30 and the photoresist film 31 as a mask, and first and second ion implanted layers 32 and 33 are formed.

In this process, for example, arsenic ions are implanted by implantation condition of approximately $3 \times 10^{12}/cm^2$ at the acceleration voltage of approximately 160 KeV and phosphorus ions are implanted by implantation condition of approximately $4 \times 10^{12}/cm^2$ at the acceleration voltage of approximately 50 KeV.

Figure 11:
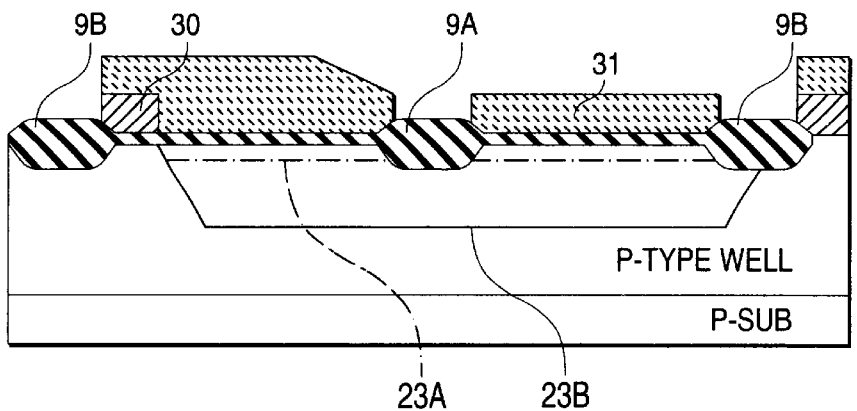
FIG. 11 is a sectional view showing the second fabricating method of a semiconductor device according to the invention.

Next, as shown in FIG. 11, a predetermined region of the surface of the substrate is selectively oxidized using the oxidation-proof (SiN) film 31 formed on the substrate 1 and including the polycrystalline silicon film 30 as a mask by the polybuffered LOCOS method, and the selective oxide film 9A having the thickness of approximately 600 nm and an element isolation film 9B having the thickness of approximately 730 nm are formed. In the selective oxidation, arsenic ions are diffused inside the substrate 1 because of difference in a diffusion coefficient between the arsenic ions and phosphorus ions respectively implanted in the superficial layer of the substrate as described above, a first N– layer 23A is formed in a relatively superficial layer of the substrate, the phosphorus ions are diffused inside the substrate 1 and a second N– layer 23B is formed in a relatively deep position in the P-type well region 21.

This process is a characteristic process in the invention, arsenic ions which are to be taken in a selective oxide film when the selective oxide film is formed as in the conventional type and the concentration of which is to be reduced are never diffused in the substrate more than the needed implantation condition by selectively oxidizing in a state in which the polycrystalline silicon film 30 on the drift region formation region is removed when a drift region 23 (the first N– layer 23A and the second N– layer 23B) is formed and the distribution of the desired concentration is acquired.

Figure 18:
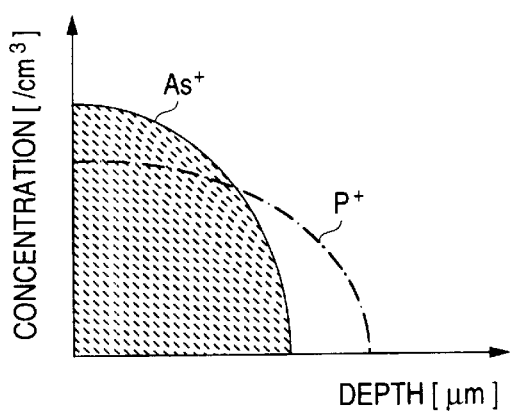
FIG. 18 shows the distribution of the concentration of various ions in a drift region.
Figure 19:
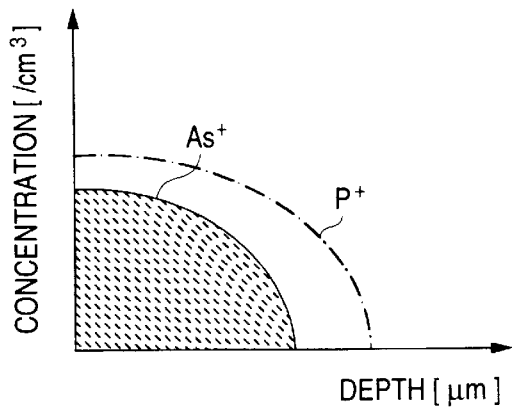
FIG. 19 shows the distribution of the concentration of various ions in a drift region.
Figure 20:
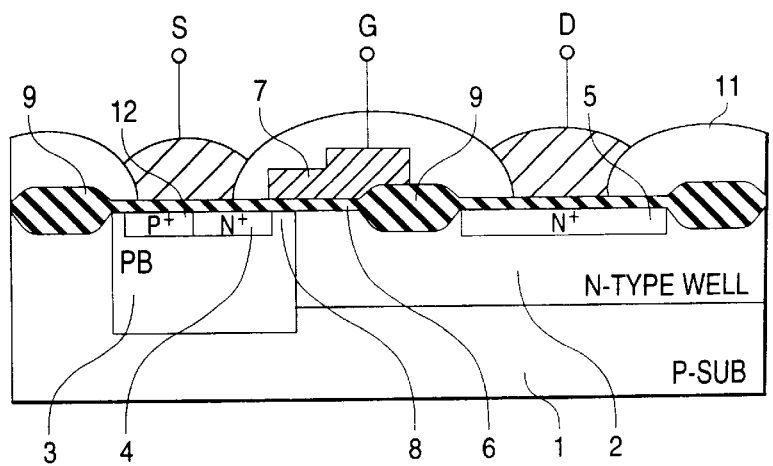
FIG. 20 is a sectional view showing a conventional type semiconductor device.

FIG. 18 shows the distribution of the concentration of phosphorus ions and arsenic ions in the drift region formed according to a first fabricating method and FIG. 19 shows the distribution of the concentration of phosphorus ions and arsenic ions in the drift region formed according to a second fabricating method. As clear from these drawings, in the drift region formed according to the second fabricating method, the concentration of arsenic ions in the vicinity of the surface of the substrate is lower, compared with that in the drift region formed according to the first fabricating method.

Further detailedly, the selective oxide film 9A is slightly thinner, compared with the element isolation film 9B, however, the thickness of the selective oxide film 9A is not required to be as thick as that of the element isolation film 9B and this process can be applied without hindrance.

Figure 12:
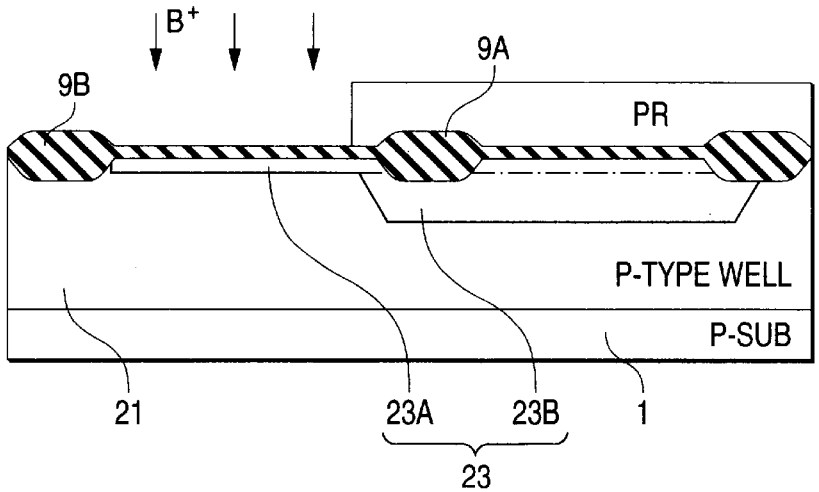
FIG. 12 is a sectional view showing the second fabricating method of a semiconductor device according to the invention.

After the similar process to the first fabricating method shown in FIGS. 4 to 8, the semiconductor device by the second fabricating method is completed. That is, as shown in FIG. 12, after a photoresist (PR) film is formed over the substrate 1 in a drain formation region, phosphorus ions forming the second N– layer 23B in a source formation region are offset by the following boron ions by implanting and diffusing P-type impurities such as boron ions in the superficial layer of the substrate in the source formation region using the photoresist film as a mask and the second N– layer 23B in the source formation region is offset.

In this process, after for example, boron ions are implanted by implantation condition of approximately $8 \times 10^{12}/cm^2$ at the acceleration voltage of approximately 80 KeV, they are thermally diffused at approximately 1100° C. for two hours.

Figure 13:
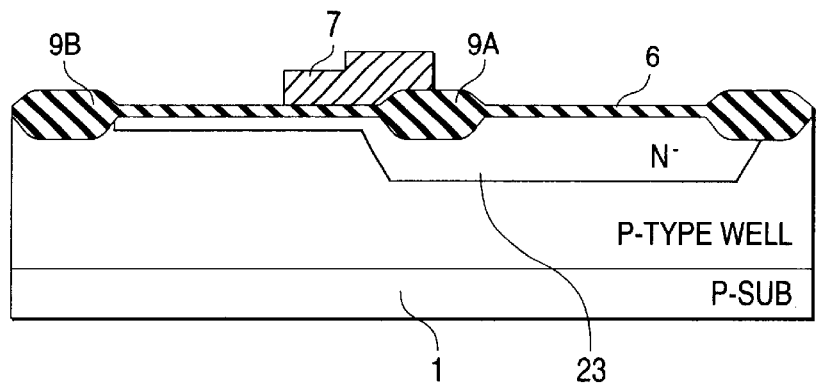
FIG. 13 is a sectional view showing the second fabricating method of a semiconductor device according to the invention.

Next, as shown in FIG. 13, after the gate oxide film 6 having the thickness of approximately 80 nm is formed on the substrate 1, the gate electrode 7 having the thickness of approximately 250 nm is formed from an region on the gate oxide film 6 to an region on the selective oxide film 9A.

Figure 14:
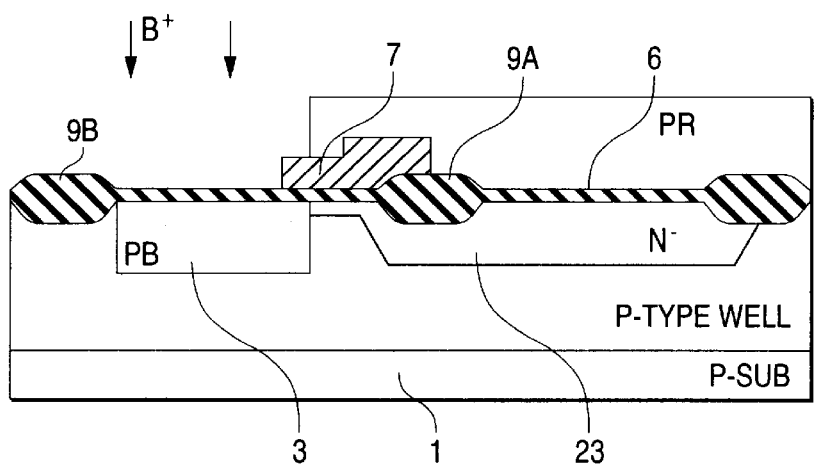
FIG. 14 is a sectional view showing the second fabricating method of a semiconductor device according to the invention.

Next, as shown in FIG. 14, the P-type body region 3 is formed in a state in which the P-type body region is adjacent to one end of the gate electrode 7 by implanting and diffusing P-type impurities such as boron ions using a photoresist (PR) film formed so that the photoresist film covers the gate electrode 7 and the drain formation region as a mask.

In this process, after for example, boron ions are implanted by implantation condition of approximately $5 \times 10^{13}/cm^2$ at the acceleration voltage of approximately 40 KeV, they are thermally diffused at approximately 1050° C. for two hours.

Figure 15:
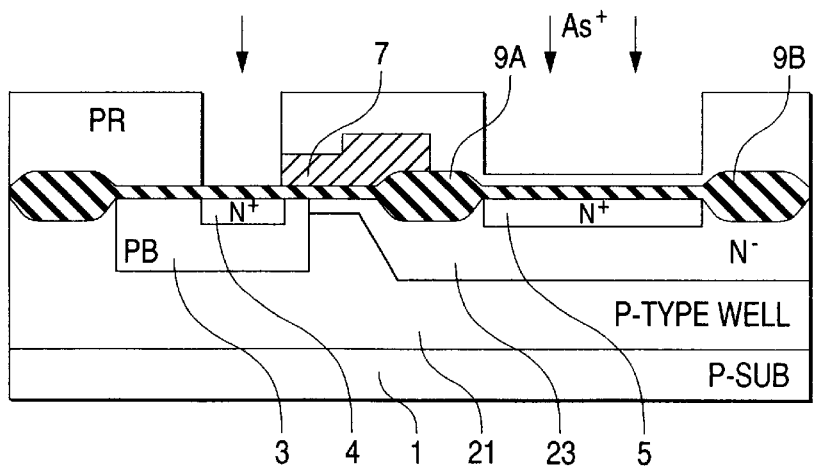
FIG. 15 is a sectional view showing the second fabricating method of a semiconductor device according to the invention.

Further, as shown in FIG. 15, N-type impurities such as phosphorus ions and arsenic ions are implanted using a photoresist (PR) film having an opening over the source formation region formed in the P-type body region 3 and over the drain formation region as a mask and N+-type diffusion regions 4 and 5 to be a source region and a drain region are formed.

The N+-type diffusion regions 4 and 5 may also have so-called LDD structure and in this case, first, after phosphorus ions for example are implanted by implantation condition of approximately $3.5 \times 10^{13}/cm^2$ at the acceleration voltage of approximately 40 KeV using the gate electrode 7, the selective oxide film 9A and a photoresist film not shown as a mask, a side wall spacer film is formed on the side of the gate electrode 7 and arsenic ions for example are implanted by implantation condition of approximately $5 \times 10^{15}/cm^2$ at the acceleration voltage of approximately 80 KeV using the side wall spacer film, the gate electrode 7, the selective oxide film 9A and the photoresist film not shown as a mask.

Figure 16:
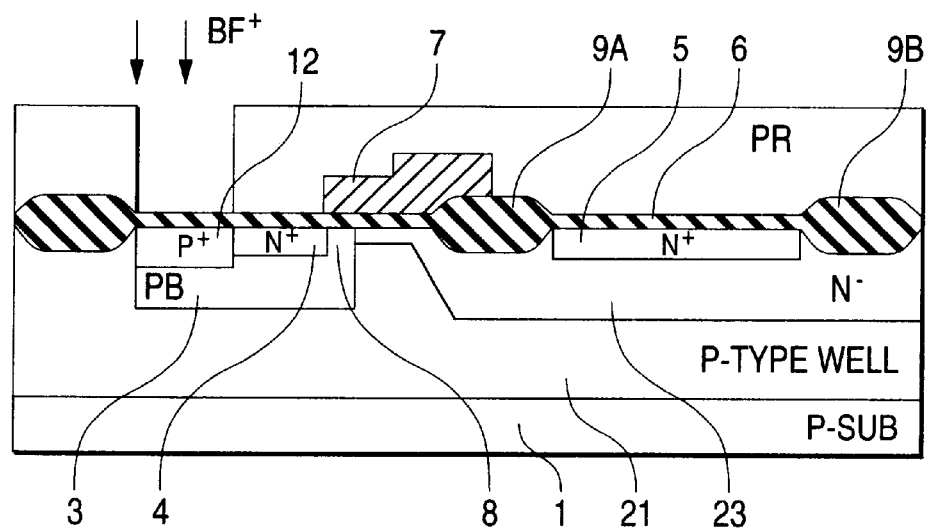
FIG. 16 is a sectional view showing the second fabricating method of a semiconductor device according to the invention.

As shown in FIG. 16, to form the P-type diffusion region 12 formed in a position adjacent to the N-type diffusion region 4 for applying electric potential to the P-type body region 3, P-type impurities such as boron difluoride ions are implanted using a photoresist (PR) film as a mask. In this process, for example, boron difluoride ions are implanted by implantation condition of approximately $4 \times 10^{15}/cm^2$ at the acceleration voltage of approximately 60 KeV.

Figure 17:
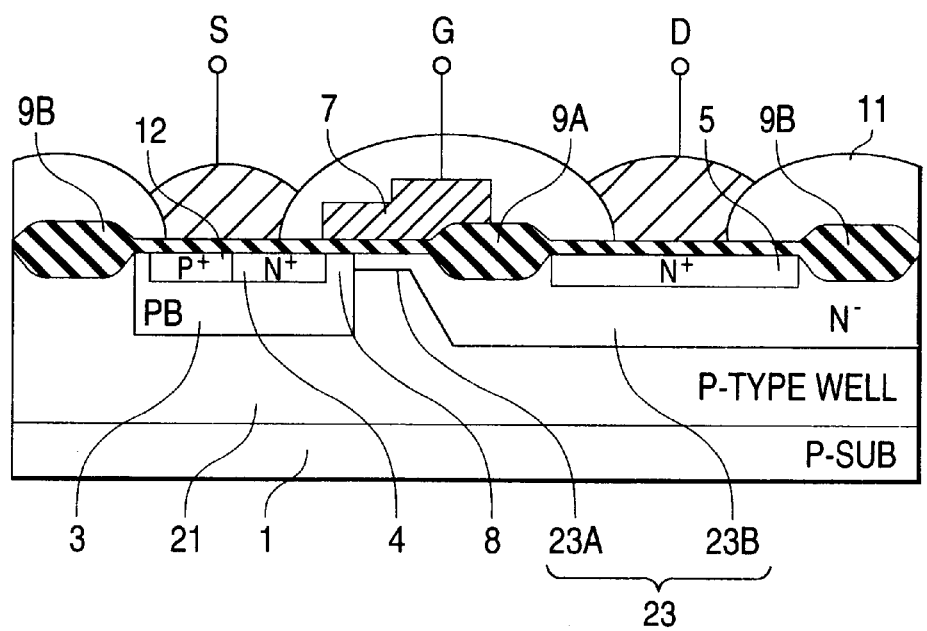
FIG. 17 is a sectional view showing the second fabricating method of a semiconductor device according to the invention.

As shown in FIG. 17, the layer insulation film 11 is formed as in the conventional configuration, the source electrode (S) and the drain electrode (D) are formed and the semiconductor device is completed.

The operating withstand voltage of the semiconductor device formed as described above can be enhanced up to approximately 40 V.

According to the invention, withstand voltage can be further enhanced by optimizing the process for forming the drift region formed utilizing difference in a diffusion coefficient between at least two types of second conductive type of impurities different in a diffusion coefficient and at least one type of first conductive type of impurities having a diffusion coefficient substantially equal to or exceeding the diffusion coefficient of at least one type of second conductive type of impurities of at least the two types.

What is claimed is:

1. A method of fabricating a semiconductor device comprising:

providing a semiconductor substrate;

providing a drift region in the semiconductor substrate;

providing a gate electrode over the semiconductor substrate through first and second gate insulating films having different thickness, and said first and second gate insulating films adjacently disposed over the substrate;

providing a source region at one side of the gate electrode; and providing a drain region at another side of the gate electrode and opposite to the source region;

wherein providing the drift region comprises configuring said drift region to extend from under the gate electrode to under the drain region and to start thin under the gate electrode and become thick near the drain region, by implanting at least two types of impurities of a second conductive type having different diffusion coefficients and at least one type of impurities of a first conductive type having a diffusion coefficient substantially equal to or larger than tile diffusion coefficient of one of said two types of impurities of the second conductive type.

2. A method of fabricating a semiconductor device according to claim 1, wherein providing, the drift region comprises:

forming the second gate insulating film by oxidation;

doping in the substrate, the two types of the second conductive type impurities having different diffusion coefficients;

forming the first gate insulating film and an element isolation film by selective oxidation, said element isolation film separated from the first gate insulating film by the second gate insulating film; and doping in the substrate, the one type of the first conductive type impurities having the diffusion coefficient substantially equal to or greater than the diffusion coefficient of said one type of the second conductive type impurities.

3. A method of fabricating a semiconductor device according to claim 2, wherein doping the two types of impurities comprises implanting and diffusing ions, and diffusing the ions is performed substantially simultaneously with forming the first gate insulating film and the element isolation film.

4. A method of fabricating a semiconductor device according to claim 3, wherein doping the two types of impurities comprises implanting and diffusing arsenic ions and phosphorus ions; and doping the one type of impurities comprises implanting boron ions selectively into a part of a region implanted by said arsenic ions and phosphorus ions so that phosphorus ions are offset by boron ions.

5. A method of fabricating a semiconductor device according to claim 2, wherein forming the first gate insulating film and the element isolation film comprises a buffered LOCOS step of selectively oxidizing the semiconductor substrate on which oxide film and either a polycrystalline silicon film or an amorphous silicon film has been laminated successively.

6. A method of fabricating a semiconductor device according to claim 5, wherein said buffered LOCOS step is applied after a region that is to be a drift region has been doped with the two types of impurities.

7. A method of fabricating a semiconductor device, comprising:

forming a gate oxide film and a polycrystalline silicon film, or an oxide film and an amorphous silicon film on a semiconductor layer of a first conductive type;

removing selectively the polycrystalline silicon film or the amorphous silicon film to expose a pre-drift region of the semiconductor layer;

implanting two types of impurities of a second conductive type into the pre-drift region;

to form an selective oxide film, selectively oxidizing a surface on the semiconductor layer using an oxidation-proof film formed on the semiconductor layer, which includes the polycrystalline silicon film or the amorphous silicon film, as a mask;

diffusing the two types of impurities to form a deep layer and a relatively superficial layer respectively in the semiconductor layer based on the differences in diffusion coefficients between the two types of impurities;

removing the oxidation-proof film;

disposing a photoresist film as a mask over a region of the semiconductor layer where a drain region is to be formed;

implanting and diffusing impurities of a first conductive type in a part of the deep layer to be formed into a source region to offset the impurities of the second conductive type in the same deep layer;

removing the photoresist film;

forming a gate electrode partially on the selective oxide film and partially oil the gate oxide film; forming a body region of the first conductive type at one end of the rate electrode by implanting and diffusing impurities of the first conductive type using a photoresist film as a mask that covers the gate electrode and a region to be formed into a drain region at a side of the gate electrode opposite to the body region; and forming the source region and the drain region by implanting impurities of the second conductive type using a mask respectively having an openings at both sides of the gate electrode.

8. A semiconductor device formed by using the method of fabricating a semiconductor device according to claim 1, comprising:

a semiconductor substrate;

a gate electrode formed on the semiconductor substrate through first and second gate insulating films having different thickness;

a source region formed so that the source region is at one side of the gate electrode;

a drain region formed at a side of the gate electrode opposite to the source region; and a drift region extending from a region under the gate electrode to under the drain region, wherein said drift region starts thin under the gate electrode and becomes thick near drain region; and an impurity concentration in said drift region under the First gate insulating film is lower than that under the second gate insulating film which is thinner than the first gate insulating film.

* * * * *